United States Patent [19]

Sakurai

[11] Patent Number: 5,089,864
[45] Date of Patent: Feb. 18, 1992

[54] INSULATED GATE TYPE SEMICONDUCTOR DEVICE

[75] Inventor: Kenya Sakurai, Matsumoto, Japan
[73] Assignee: Fuji Electric Co., Ltd., Kawasaki, Japan
[21] Appl. No.: 580,644
[22] Filed: Sep. 10, 1990
[30] Foreign Application Priority Data
  Sep. 8, 1989 [JP] Japan .................... 1-233619
[51] Int. Cl.$^5$ ............................ H01L 29/78
[52] U.S. Cl. .................... 357/23.4; 357/37; 357/38; 357/39
[58] Field of Search .......... 357/23.4, 37, 38, 39

[56] References Cited

U.S. PATENT DOCUMENTS

| | | | |
|---|---|---|---|
| 4,466,176 | 8/1984 | Temple | 357/23.4 |
| 4,618,872 | 10/1986 | Baliga | 357/23.4 |
| 4,682,195 | 7/1987 | Yilmaz | 357/23.4 |
| 4,689,647 | 8/1987 | Nakagawa et al. | 357/23.4 |
| 4,742,380 | 5/1988 | Chang et al. | 357/23.4 |
| 4,809,045 | 2/1989 | Yilmaz | 357/38 |
| 4,928,155 | 5/1990 | Nakagawa et al. | 357/23.4 |

FOREIGN PATENT DOCUMENTS

| | | | |
|---|---|---|---|
| 59-149058 | 8/1984 | Japan | 357/23.4 |
| 61-80859 | 4/1986 | Japan | 357/23.4 |
| 62-113477 | 5/1987 | Japan | 357/38 |
| 62-152169 | 7/1987 | Japan | 357/23.4 |

OTHER PUBLICATIONS

IEEE Transactions on Electron Devices, vol. ED-31, No. 12, Dec. 1984, "Optimum Design of Power MOSFET's" by Hu et al, pp. 1693-1700.

Primary Examiner—Rolf Hille
Assistant Examiner—Steven Loke
Attorney, Agent, or Firm—Brumbaugh, Graves, Donohue & Raymond

[57] ABSTRACT

This invention relates to an insulated gate type semiconductor device having an increased breakdown endurance capacity. According to the present invention, by decreasing the space between base regions or increasing the widths of adjacent base regions of cells near a connecting conductor fixed portion of a common emitter electrode of an IGBT or a common source electrode of an insulated gate type MOSFET so that the ratio between both falls within the range of 0.2 to 0.4, it is possible to suppress the latch-up phenomenon or the latch-back phenomenon which is liable to occur because of a local temperature rise caused by concentration of electric current. Furthermore, it is possible to limit the increase of the forward voltage drop in that case to within a range that does not inhibit practical use of the device. With this, either latch-up endurance capacity, in the case of a IGBT, or latch-back endurance capacity, in the case of an insulated gate type MOSFET, is improved.

17 Claims, 3 Drawing Sheets

INSULATED GATE TYPE SEMICONDUCTOR DEVICE

BACKGROUND OF THE INVENTION

The present invention relates to an insulated gate type semiconductor device in which a plurality of cells, each having a MOS structure, are provided on a principal plane of the same semiconductor substrate or layer and a connecting conductor is fixedly attached to a part of a common electrode which is connected to respective semiconductor cells.

Demand for a power switching element with higher withstand voltage, higher power, and a higher speed has increased in recent years. Accordingly, the use of a vertical type power MOSFET (insulated gate MOSFET), which controls an electric current which is in contact with both principal planes of a semiconductor substrate by means of a plurality of MOS structures provided on the surface has grown rapidly, with use as a switching power supply being the principal application. Furthermore, the range of principal use of a conductivity modulation type MOSFET, in which a layer of a different conductive type, or conductivity type, which terms shall be used interchangeably, is provided on the opposite side of the principal plane on which the MOS structure is installed and in which ON resistance is lowered by utilizing conductivity modulation, is increasing through the use of inverter controls for which higher withstand voltage and higher power are required. The conductivity modulation type MOSFET is also referred to as an insulated gate type bipolar transistor, and abbreviated as IGBT hereinafter.

FIG. 2 shows a structure of an IGBT, in which an n⁻ type drift region or first semiconductor layer 2, of high resistance is laminated on a p⁺ type substrate or second semiconductor layer 1 which becomes a collector region. In the surface layer of the drift region 2, a plurality of p-type channel diffused regions (base regions) 3 are formed, and p⁺ wells 4, of low resistance, are provided at the centers thereof. A pair of limited regions which are either emitter regions, in the case of a bipolar device, or source regions in the case of a field effect device, and which are, in this case n⁺ type emitter regions 5 are formed at a space in the surface layer of the base regions 3. In a hybrid insulated gate type device the limited regions 5 may be emitter regions in the base of one device and source regions in the base of an adjacent device. In order to form an n-type channel in a surface layer 31 of the channel diffused regions 3 which is between the drift region 2 and the emitter regions 5, a gate electrode 7 which is connected to a gate terminal G is provided through a gate oxide film 6. A common emitter electrode 9 which is in contact with p⁺ wells 4, and also in contact with the emitter regions 5 of individual cells, is provided. A conductor 11, for connecting the emitter electrode 9 to an emitter terminal E, is provided, for instance by bonding an aluminum wire to the emitter electrode. Furthermore, a collector electrode 10, connected to a collector terminal C, is in contact with the collector region 1.

FIG. 3 shows the structure of a power MOSFET, in which an n⁻ type drain region 22, of high resistance, is laminated on an n⁺ type substrate 21 which becomes a drain contact layer. A plurality of p-type channel diffused regions (base regions) 3 are formed in the surface layer of the drain region 22, and p⁺ wells 4 with low resistance are provided at the centers thereof. A pair of limited regions, in this case n⁺ type source regions 25 are formed at a portion or a space in the surface layer of the channel diffused region or base region 3. In order to form an n-type channel in a surface layer 31 of the base region 3 which is put between the drain region 22 and the source region 25, a gate electrode 7 which is connected to a gate terminal G is provided through a gate oxide film 6. A common source electrode 29 which is in contact with the p⁺ well 4, and also in contact with the source region 25 of individual cells, is provided. A conductor 11, for connecting the source electrode 29, to a source terminal S, is fixedly attached, for instance by bonding an Al wire to the source terminal. Furthermore, a drain electrode 30, connected to a drain terminal D, is in contact with the drain contact layer 21.

In the IGBT shown in FIG. 2, the emitter region 5, the base region 3 and the drift region 2 form an npn transistor 41 which is a first parasitic bipolar transistor. The base region 3, the drift region 2 and the collector region 1 form a pnp transistor 42, which is a second parasitic bipolar transistor. These transistors have current gains $\alpha 1$ and $\alpha 2$, respectively, and show a pnpn thyristor structure, which latches under the ON state when the sum of the current gains is greater than or equal to 1, that is when $\alpha 1 + \alpha 2 \geq 1$. When the parasitic thyristor latches, the IGBT loses gate control of the electric current and is led to breakdown finally. This phenomenon is called latch-up.

In the power MOSFET shown in FIG. 3, the source region 25, the base region 3 and the drain region 22 form a parasitic npn bipolar transistor 41. One of the causes of activation of this parasitic bipolar transistor is the flow of the majority carrier in the base region which flows to the source electrode 29 through the base region 3 just under the source region 25. This flow of carrier generates voltage drop along the source and base junction portion. When this voltage drop exceeds the threshold voltage of approximately 0.7 V, this junction portion is biased in the forward direction and this parasitic bipolar transistor is turned ON. When this happens, control of the electric current in the MOSFET with the gate signal becomes impossible thus leading to breakdown. This phenomenon is called latch-back.

As described, both the IGBT and the insulated gate type MOSFET include either a parasitic pnpn thyristor or a parasitic npn transistor as shown in FIG. 2 and FIG. 3, respectively. These parasitic elements lead to sudden latch-up or latch-back phenomenon, particularly at high voltage, high electric current and high temperature. The control function of the gate is lost, thus leading to breakdown. In a conventional IGBT and insulated gate type MOSFET, measures such as reduction of the base resistance by means of the p⁺ well 4, reduction of majority carrier in the base region (See L. A. Goodman: International Electron Devices Meeting, 1984), or reduction of the electric current, which is concentrated in the vicinity of the emitter and base junction portion of a cell (See Yilmaz U.S. Pat. No. 4,809,045) have been taken for the purpose of preventing activation of these parasitic elements. However, satisfactory results have not been obtained with these measures.

Accordingly, it is an object of the present invention to solve the above-described problems and to provide an insulated gate type semiconductor device having an enlarged application range by preventing latch-up and latch-back phenomena caused by parasitic element activation.

SUMMARY OF THE INVENTION

In order to achieve the above-described object, the present invention provides an insulated gate type semiconductor device in which a plurality of base regions of a second conductive type are provided on a surface portion of a semiconductor layer of a first conductive type. Semiconductor regions of the first conductive type are formed on respective surface portions of these base regions. A gate electrode is provided through an insulating film on a portion put between the semiconductor layer of the first conductive type and the semiconductor regions of the first conductive type. A connecting conductor is fixedly attached to part of a common main electrode which is in contact with respective base regions and semiconductor regions of the first conductive type on the surface portions thereof.

The latch-up or latch-back phenomenon is greatly reduced by structuring the device such that the ratio of the space or distance between adjacent base regions, and consequently adjacent semiconductor cells, at a portion near-by to or in a first region in the vicinity of a conductor connection, the portion where the connecting conductor of the main electrode is fixedly attached, to the width of the base region, in the direction substantially parallel to the semiconductor layer of the first conductive type falls within a range of 0.2 to 0.4.

BRIEF DESCRIPTION ON THE DRAWINGS

DESCRIPTION OF A PREFERRED EMBODIMENT

Figure 2:
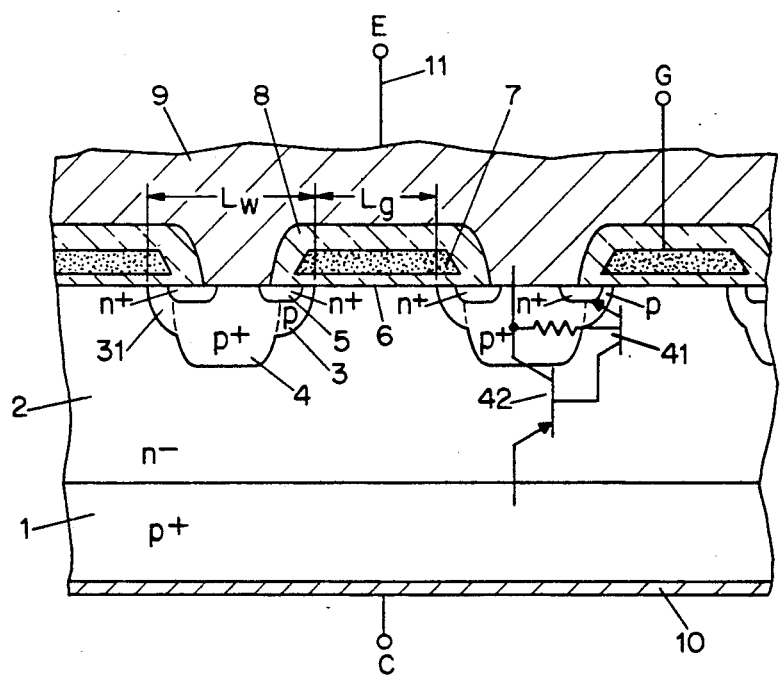
FIG. 2 is a sectional view of a conventional IGBT.
Figure 4:
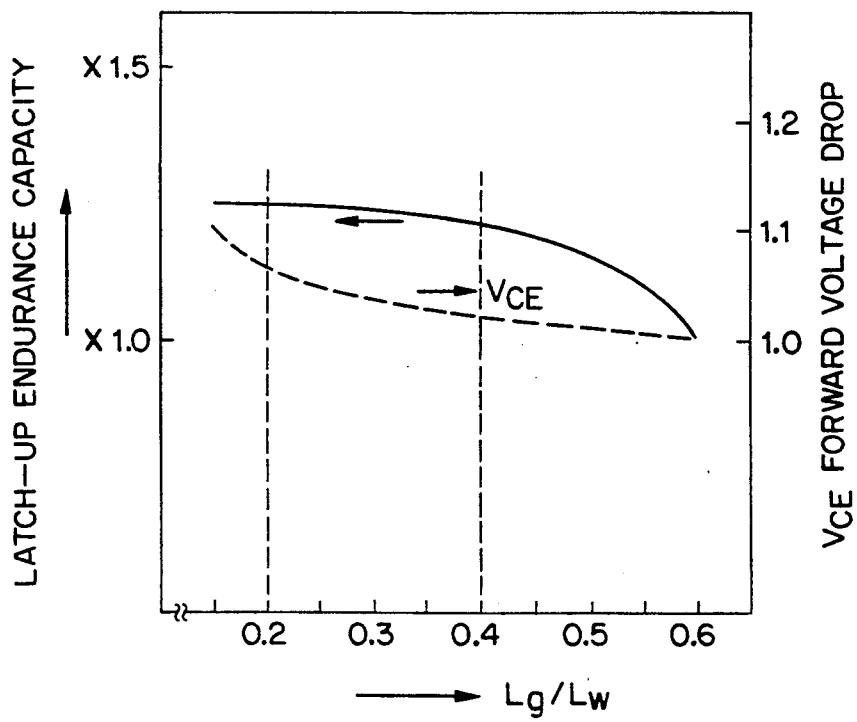
FIG. 4 is a relational diagram of latch-up endurance capacity, forward voltage drop, and the $L_g/L_w$ ratio in an IGBT.

It has been ascertained through analysis of breakdown phenomena in a load short-circuit endurance capacity test on an inverter circuit, in a practical application of an IGBT for instance, that the breakdown is started just under or in the periphery or vicinity of an Al conductor bonding portion of an emitter electrode. This is a result of the concentration of electric current, in the semiconductor substrate, in the vicinity of the point or area at which the Al conductor is attached. This causes temperature to rise, which increases generation of the latch-up phenomenon in this vicinity. The same is true of the latch-back phenomenon in a power MOSFET. In accordance with the present invention, when horizontal carrier current density in the base region just under the first conductive type semiconductor region is lowered, by either widening the base region width or narrowing the space between base regions of the cell, in the first region in the vicinity of the area where the connecting conductor is fixed to the main electrode which is in contact with the base region, generation of the latch-up or latch-back phenomenon in the vicinity of the connecting conductor, where temperature rise occurs locally, is suppressed and the breakdown endurance capacity may be increased. The forward voltage drop at this portion is sharp, and the resistance to electric current flow is greater at this portion than other portions even at the time of load short-circuit, thereby suppressing latch-up and latch-back further. With the above construction in accordance with the invention, however, the forward voltage drop rises simultaneously with the improvement of latch-up or latch-back endurance capacity. It is assumed that the width of the p-type base region 3 is $L_w$, and the space or distance between said base regions is $L_g$ as shown in FIG. 2. The relationship between latch-up endurance capacity, forward voltage drop $V_{CE}$, of the IGBT cell, and $L_g/L_w$ is shown in FIG. 4 taking the case of a conventional IGBT in which $L_g/L_w$ is 0.6 at VCE=1. It should be recognized from FIG. 4 that decreasing $L_g/L_w$ to within the range of 0.2 to 0.4 is suitable for increasing the latch-up endurance capacity without increasing the forward voltage drop $V_{CE}$ notably. A similar relationship also exists between the latch-back endurance capacity, the forward voltage drop $V_{DS}$ and the ratio $L_g/L_w$ in a power MOSFET.

Figure 1:
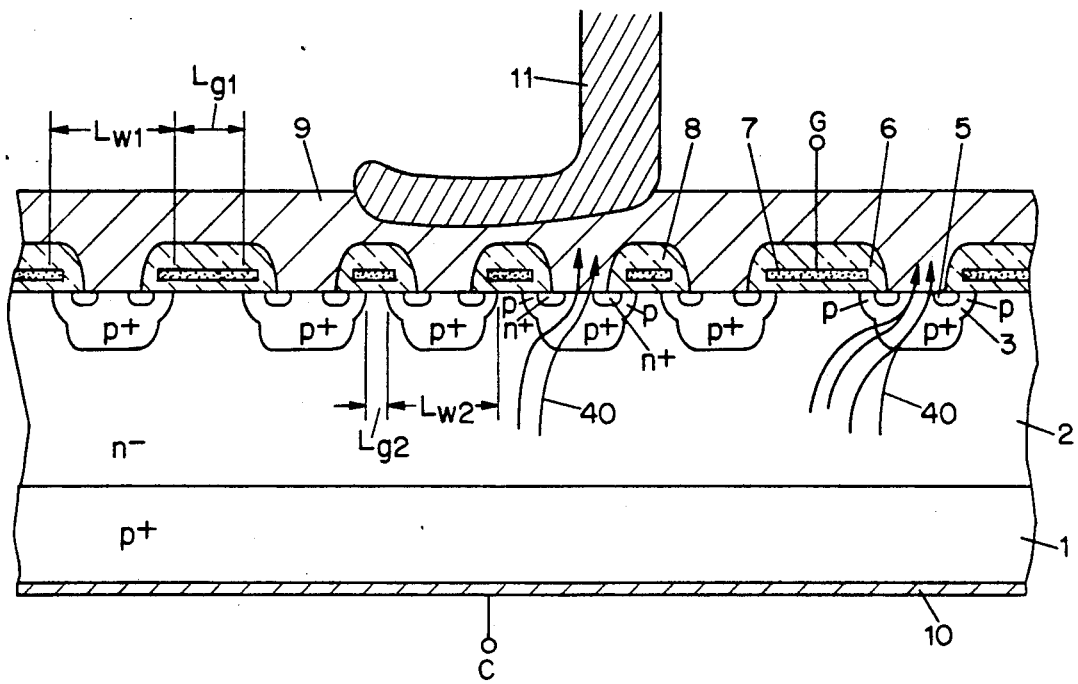
FIG. 1 is a sectional view of a principal part of an IGBT showing an embodiment of the present invention.

FIG. 1 is a sectional view showing an embodiment of an IGBT according to the present invention. Those portions that are common to FIG. 2 are labeled the same. In FIG. 1, a width $L_{w2}$ of a p-type base region 3 under a bonding portion of conductor 11, such as an Al wire bonded to an emitter electrode 9, is approximately 20 μm which is almost equal to a width $L_{w1}$ of a p-type base region which is off from the bonding portion. A space or distance $L_{g2}$, between adjacent p-type base regions just under the bonding portion of the conductor 11 is approximately 4 μm, which is smaller than a space $L_{g1}$ of approximately 12 μm, between regions which are off from the bonding portion. Because of this, as shown in the Figure, the density of a horizontal positive hole current 40, as shown in FIG. 1, in a p-type base region just under an emitter region 5 is smaller, just under the bonding portion of the conductor 11. As a result, the latch-up phenomenon is suppressed. $L_g/L_w$ in this case is 0.2 in a first region in the vicinity of the conductor connection just under the bonding position, and is 0.6 in a second region further from said conductor connection at a position which is away from and not directly under the bonding portion. Furthermore, when $L_{g2}$ is narrowed or $L_{w2}$ is widened, $L_g/L_w$ becomes 0.2 and lower, and the forward voltage drop VCE becomes too big as shown in FIG. 4. For this reason in the vicinity of a lead wire, a ratio of $L_g/L_w$ between 0.2 and 0.4 is best while in regions other than this vicinity $L_G/L_W$ remains at values greater than 0.4, e.g., at values near 0.6.

Figure 3:
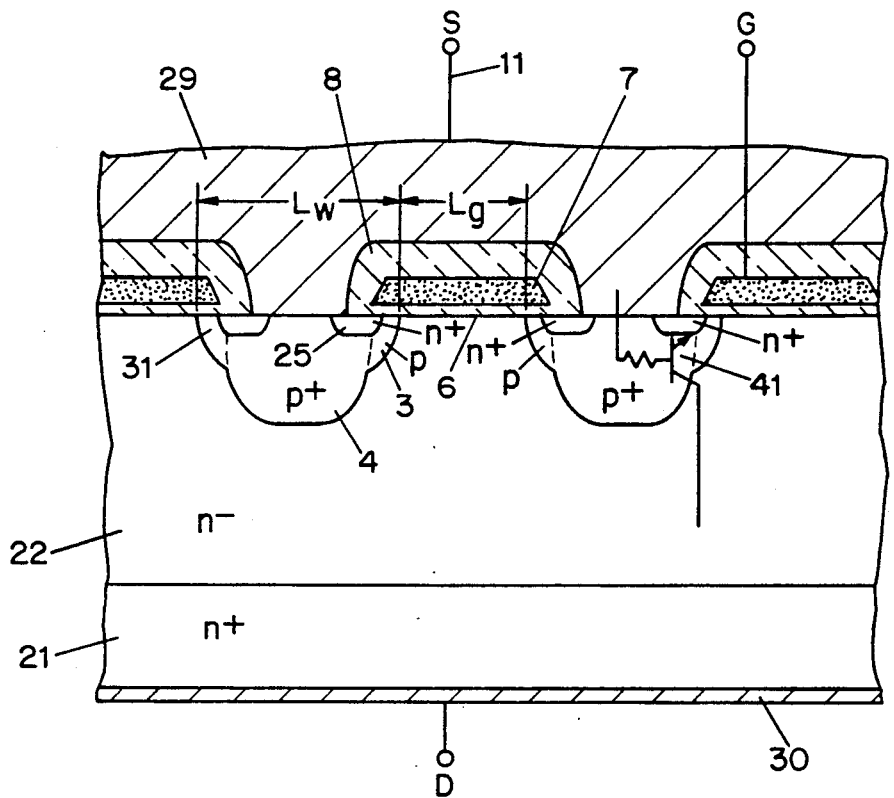
FIG. 3 is a sectional view of a conventional insulated gate type MOSFET.
Figure 5:
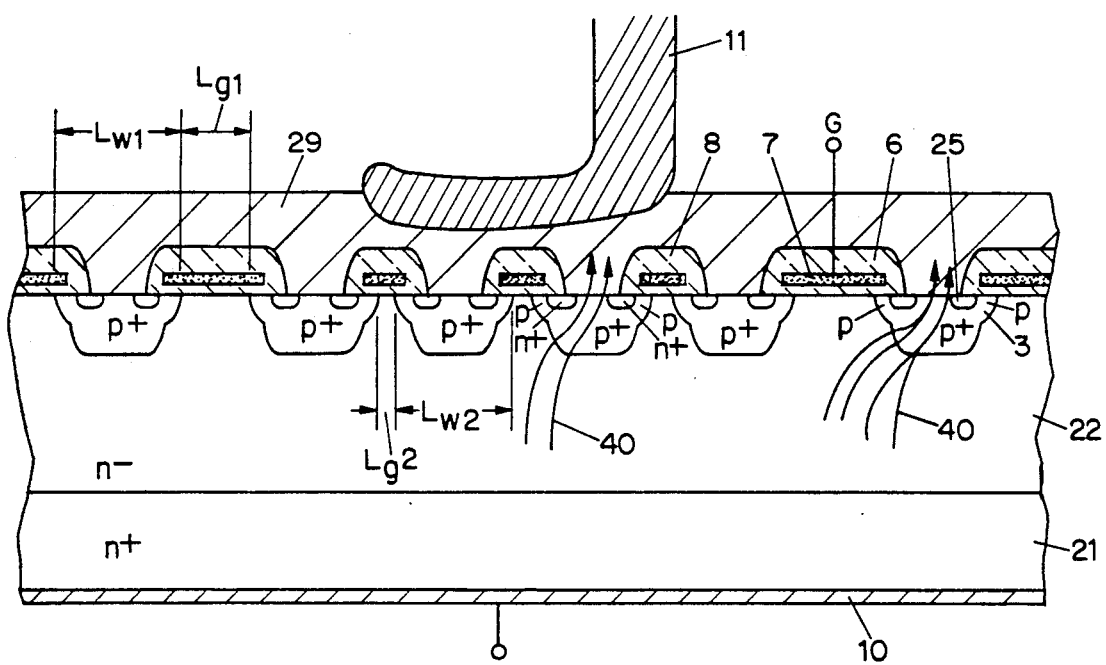
FIG. 5 is a sectional view of a principal part of an insulated gate type MOSFET showing an embodiment of the present invention.

A power MOSFET or insulated gate type MOSFET, according to the present invention will not be discussed in detail. FIG. 5 is an embodiment of such an insulated gate type MOSFET according to the present invention. Elements corresponding to FIG. 1, the IGBT according to the present invention, and FIG. 3, the prior art MOSFET, are labeled the same. It is clear from the above discussion the latch-back phenomenon may be suppressed in a similar manner.

While there have been described what are believed to be a preferred embodiment of the present invention, those skilled in the art will recognize that modifications to what has been specifically described can be made without exceeding the scope of this invention which is intended to claim all such changes and modifications or the like.

I claim:

1. An insulated gate type semiconductor device comprising (a) a plurality of spaced semiconductor cells, each such cell including limited regions formed in a surface portion of a base region formed in a surface portion of a semiconductor layer and an insulated gate electrode portion coupled to said base region and said semiconductor layer, (b) a common main electrode coupled to said limited and base regions of said plurality of spaced semiconductor cells, and (c) a conductor connected to said common main electrode so as to tend to produce during operation a higher concentration of current in the vicinity of said conductor connection than in other areas of said common main electrode, wherein the improvement comprises:

semiconductor cells, in a first region in the vicinity of said conductor connection, having base regions of adjacent semiconductor cells spaced by a distance of from 0.2 to 0.4 times the width of the base regions of said cells in said first region; and semiconductor cells, in a second region further from said conductor connection than said first region, having base regions of adjacent semiconductor cells spaced by a distance of greater than 0.4 times the width of the base regions of said cells in said second region;

whereby breakdown characteristics are improved.

2. An insulated gate type semiconductor device according to claim 1 wherein said distance between base regions of adjacent semiconductor cells, in a first region in the vicinity of said conductor connection, is approximately 0.2 times the width of the base regions of said cells in the vicinity of said conductor connection, and base regions of adjacent semiconductor cells, in a second region further from said conductor connection, are spaced by a distance approximately 0.6 times the width of said base regions.

3. An insulated gate type semiconductor device according to claim 1 wherein the width of each of said base regions, in said first and second regions, is substantially the same.

4. An insulated gate type semiconductor device according to claim 1 wherein:

said limited regions are a first conductive type;
said base regions are a second conductive type; and
said semiconductor layer is a first conductive type.

5. An insulated gate type semiconductor device according to claim 4 wherein said first conductive type is n-type.

6. An insulated gate type semiconductor device according to claim 1 wherein said conductor connection overlaps several semiconductor cells.

7. An insulated gate type bipolar transistor comprising (a) a plurality of spaced semiconductor cells, each such cell including emitter regions formed in a surface portion of a base region formed in a surface portion of a first semiconductor layer disposed on a surface portion of a second semiconductor layer and an insulated gate electrode portion coupled to said base region and said first semiconductor layer, (b) a common emitter electrode coupled to said emitter and base regions of said plurality of spaced semiconductor cells, and (c) a conductor connected to said common emitter electrode so as to tend to produce during operation a higher concentration of current in the vicinity of said conductor connection than in other areas of said common emitter electrode, wherein the improvement comprises;

semiconductor cells, in a first region in the vicinity of said conductor connection, having base regions of adjacent semiconductor cells spaced by a distance of from 0.2 to 0.4 times the width of the base regions of said cells in said first region; and semiconductor cells, in a second region further from said conductor connection than said first region, having base regions of adjacent semiconductor cells spaced by a distance of greater than 0.4 times the width of the base regions of said cells in said second region;

whereby breakdown characteristics are improved.

8. An insulated gate type bipolar transistor according to claim 7 wherein said distance between base regions of adjacent semiconductor cells, in a first region in the vicinity of said conductor connection, is approximately 0.2 times the width of the base regions of said cells in the vicinity of said conductor connection, and base regions of adjacent semiconductor cells, in a second region further from said conductor connection, are spaced by a distance approximately 0.6 times the width of said base regions.

9. An insulated gate type bipolar transistor according to claim 7 wherein the width of each of said base regions, in said first and second regions, is substantially the same.

10. An insulated gate type bipolar according to claim 7 wherein:

said emitter regions are a first conductive type;
said base regions are a second conductive type;
said first semiconductor layer is a first conductive type; and
said second semiconductor layer is a second conductive type.

11. An insulated gate type bipolar transistor according to claim 10 wherein said first conductive type is n-type.

12. An insulated gate type bipolar transistor according to claim 7 wherein said conductor connection overlaps several semiconductor cells.

13. An insulated gate type MOSFET comprising (a) a plurality of spaced semiconductor cells, each such cell including source regions formed in a surface portion of base region formed in a surface portion of a first semiconductor layer disposed on a surface portion of a second semiconductor layer and an insulated gate electrode portion coupled to said base region and said first semiconductor layer, (b) a common source electrode coupled to said source and base regions of said plurality of spaced semiconductor cells, and (c) a conductor connected to said common source electrode so as to tend to produce during operation a higher concentration of current in the vicinity of said conductor connection than in other areas of said common main electrode, wherein the improvement comprises:

semiconductor cells, in a first region in the vicinity of said conductor connection, having base regions of adjacent semiconductor cells spaced by a distance of from 0.2 to 0.4 times the width of the base regions of said cells in said first region; and semiconductor cells, in a second region further from said conductor connection than said first region, having base regions of adjacent semiconductor cells spaced by a distance of greater than 0.4 times the width of the base regions of said cells in said second region;

whereby breakdown characteristics are improved.

14. An insulated gate type MOSFET according to claim 13 wherein said distance between base regions of adjacent semiconductor cells, in a first region in the vicinity of said conductor connection, is approximately 0.2 times the width of the base regions of said cells in the vicinity of said conductor connection, and base regions of adjacent semiconductor cells, in a second region further from said conductor connection, are spaced by a distance approximately 0.6 times the width of said base regions.

15. An insulated gate type MOSFET according to claim 13 wherein the width of each of said base regions, in said first and second regions, is substantially the same.

16. An insulated gate type MOSFET according to claim 13 wherein:
   said source regions are a first conductive type;
   said base regions are a second conductive type; and
   said first semiconductor layer is a first conductive type; and
   said second semiconductor layer is a first conductive type.

17. An insulated gate type MOSFET according to claim 16 wherein said first conductive type is n-type.

* * * * *